(12) United States Patent
Shirvani

(10) Patent No.: US 9,787,252 B2
(45) Date of Patent: Oct. 10, 2017

(54) RF AMPLIFIER OPERATIONAL IN DIFFERENT POWER MODES

(71) Applicant: Qorvo US, Inc., Greensboro, NC (US)

(72) Inventor: Alireza Shirvani, Menlo Park, CA (US)

(73) Assignee: Qorvo US, Inc., Greensboro, NC (US)

( * ) Notice: Subject to any disclaimer, the term of this patent is extended or adjusted under 35 U.S.C. 154(b) by 51 days.

(21) Appl. No.: 14/557,897

(22) Filed: Dec. 2, 2014

(65) Prior Publication Data

US 2015/0155831 A1    Jun. 4, 2015

Related U.S. Application Data

(60) Provisional application No. 61/910,558, filed on Dec. 2, 2013, provisional application No. 62/055,691, filed on Sep. 26, 2014.

(51) Int. Cl.
*H03F 3/68* (2006.01)
*H03F 1/02* (2006.01)
*H03F 3/193* (2006.01)
*H03F 1/22* (2006.01)
*H03F 3/21* (2006.01)

(52) U.S. Cl.
CPC ......... *H03F 1/0211* (2013.01); *H03F 1/0261* (2013.01); *H03F 1/223* (2013.01); *H03F 3/193* (2013.01); *H03F 3/211* (2013.01); *H03F 2200/222* (2013.01); *H03F 2200/387* (2013.01); *H03F 2200/451* (2013.01); *H03F 2200/61* (2013.01)

(58) Field of Classification Search
CPC ...................................................... H03F 1/0211
USPC ................................................... 330/311, 295
See application file for complete search history.

(56) References Cited

U.S. PATENT DOCUMENTS 6,342,816 B1 * 1/2002 Gradzki .................. H03F 1/223
                                                            330/311
8,102,213 B2 * 1/2012 Tasic ....................... H03F 1/223
                                                            330/283

* cited by examiner

*Primary Examiner* — Khanh V Nguyen
*Assistant Examiner* — Khiem Nguyen
(74) *Attorney, Agent, or Firm* — Withrow & Terranova, P.L.L.C.

(57) ABSTRACT

Embodiments of a radio frequency (RF) amplification are disclosed. The RF amplification device includes a first RF amplification circuit, a second RF amplification circuit, and power control circuitry operable in a first power mode and a second power mode. The first RF amplification circuit has a cascode amplifier stage configured to amplify an RF signal. The cascode amplifier stage has an input transistor and a cascode output transistor that are stacked in cascode. The second RF amplification circuit is configured to amplify the RF signal. The power control circuitry is configured to bias the first cascode output transistor so that the first cascode output transistor operates in a saturation region in the first power mode and bias the first cascode output transistor so that the first cascode output transistor operates in a triode region in the second power mode. The second RF amplification circuit is assisted without introducing additional loading.

29 Claims, 7 Drawing Sheets

RF AMPLIFIER OPERATIONAL IN DIFFERENT POWER MODES

RELATED APPLICATIONS

This application claims the benefit of provisional patent application Ser. Nos. 61/910,558 and 62/055,691, filed Dec. 2, 2013 and Sep. 26, 2014, respectively, the disclosures of which are hereby incorporated herein by reference in their entirety.

FIELD OF THE DISCLOSURE

This disclosure relates generally to RF amplification devices.

BACKGROUND

Various communication standards require power amplifiers to have multiple power modes to obtain the best power efficiency in each mode and to decrease power consumption in power modes that require less power. A common technique for providing amplification in different power modes is to use multiple amplifiers. However, current techniques that employ multiple amplifiers often result in performance degradations since the different amplifiers tend to load one another. Alternatively, a single amplifier can be used with a DC/DC converter to dynamically adjust the amplifier supply voltage. Unfortunately, this is an expensive solution that adds significant size and cost.

Thus, inexpensive multi-power mode amplifiers are needed that do not suffer significantly from additional loading.

SUMMARY

Embodiments of a radio frequency (RF) amplification device that operates in different power modes are disclosed along with methods of operating the same. In one embodiment, the RF amplification device includes a first RF amplification circuit, a second RF amplification circuit, and power control circuitry operable in a first power mode (e.g., a high power mode) and a second power mode (e.g., a medium power mode). The first RF amplification circuit has a cascode amplifier stage configured to amplify an RF signal. The cascode amplifier stage has an input transistor and a cascode output transistor that are stacked in cascode. The second RF amplification circuit is configured to amplify the RF signal, wherein the second RF amplification circuit is coupled to the cascode amplifier stage between the first input transistor and the first cascode output transistor. The power control circuitry is operable in a first power mode and a second power mode and is configured to bias the first cascode output transistor so that the first cascode output transistor operates in a saturation region in the first power mode and biases the first cascode output transistor so that the first cascode output transistor operates in a triode region in the second power mode. In this manner, the cascode amplifier stage assists the second RF amplification circuit without introducing additional loading.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
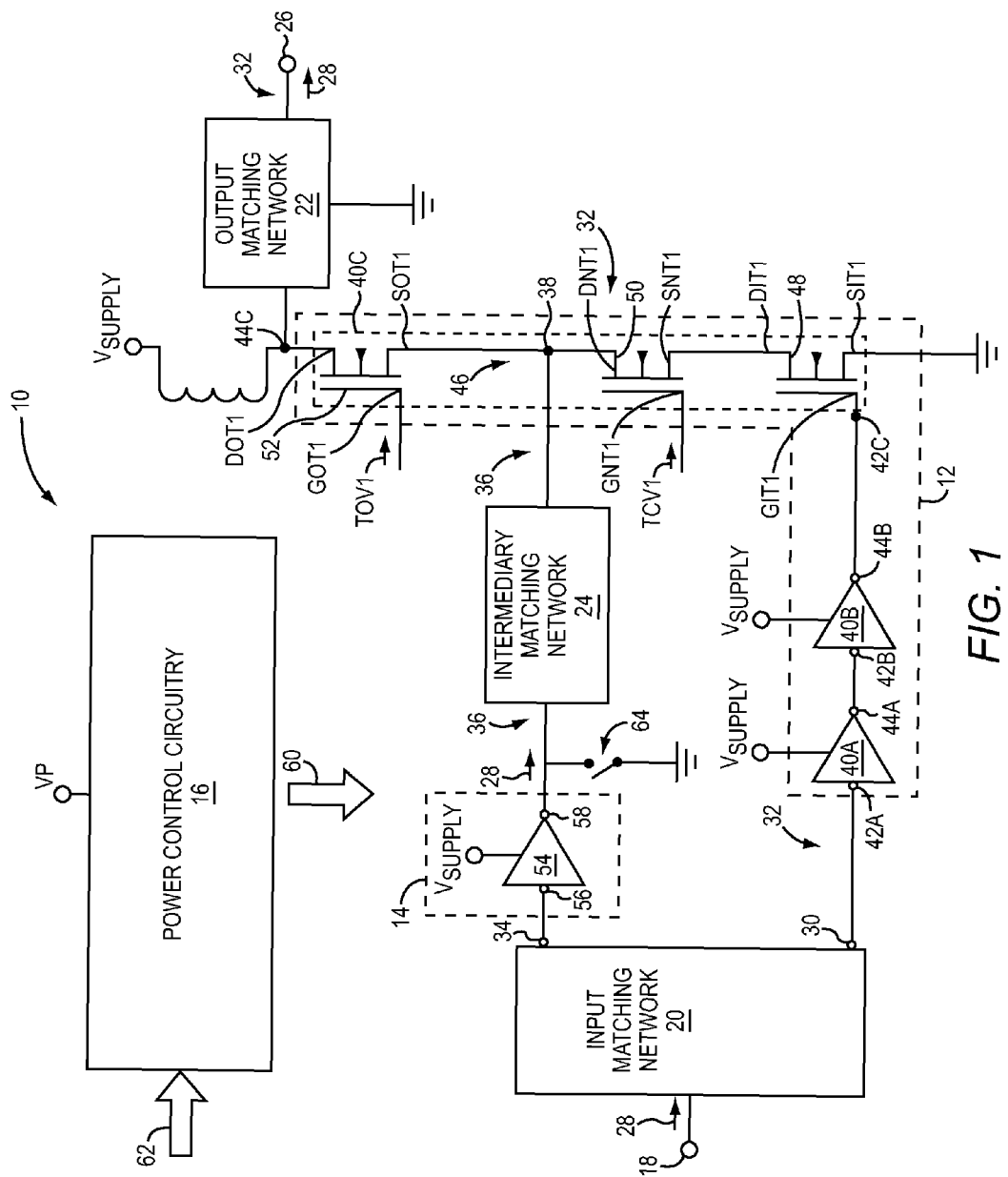
FIG. 1 illustrates one embodiment of a radio frequency (RF) amplification device having a first RF amplification circuit activated in a first power mode and a second RF amplification circuit activated in a second power mode, wherein a switch device is opened in the second power mode.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

With regard to the term "terminus," terminus refers to any conductive feature in an electronic component for receiving signals, transmitting signals, and/or establishing a connection to another electronic component. For instance, a terminus may be one or more nodes, ports, conductive pads, pins, solder bumps, terminals, leads, pins, and/or the like. To provide an exemplary terminus for receiving and/or transmitting a single-ended signal, a terminus may be provided as a single terminal utilized to receive and/or transmit the single-ended signal. However, to be clear, this disclosure is not in any way limited to single-ended signals. Thus, to provide an example with regard to differential signals, a terminus may be provided as a pair of terminals for receiving and/or transmitting a positive and negative side of the differential signal.

Also, throughout this disclosure and the accompanying claims, relative terminology, such as "approximately," "substantially," and the like, may be used in a predicate to describe features and relationships between features of a device or method. The relative terminology in the predicate should be interpreted sensu lato. However, whether the predicate employing the relative terminology is satisfied is determined in accordance to error ranges and/or variation tolerances relevant to the predicate and prescribed to the device or method by radio frequency (RF) communication standards relevant to RF application(s) employing the device or method. For example, the particular RF application employing the device or method may specify that operations are to be provided in accordance with certain RF communication standards, specifications, or the like. These RF communication standards and specifications may prescribe the error ranges and/or variation tolerances relevant to the predicate or may describe performance parameters relevant to the predicate from which the error ranges and/or variation tolerances for the device or method can be deduced or inferred.

This application relates generally to devices and methods for amplifying RF signals. More specifically, embodiments of RF amplification devices are disclosed with RF amplification circuits that are used to amplify an RF signal in different power modes. For example, an RF amplification device may include a first RF amplification circuit that amplifies the RF signal during a first power mode and a second RF amplification circuit that amplifies the RF signal during a second power mode. In one exemplary embodiment, the first RF amplification circuit is a high power amplification circuit and the first power mode is a high power mode while the second RF amplification circuit is a medium power amplification circuit and the second power mode is a medium power mode.

The first RF amplification circuit may be a single stage or multistage amplification circuit. However, whether the first RF amplification circuit is a single stage or multistage amplification circuit, the first RF amplification circuit includes a cascode amplifier stage configured to amplify the RF signal. The cascode amplifier stage includes a first input transistor and a first cascode output transistor that are stacked in cascode. The cascode amplifier stage may be provided in any suitable cascode arrangement, such as a single cascode arrangement or a double cascode arrangement. Thus, the cascode amplifier stage may include any number of intermediary cascode transistors stacked between the first cascode output transistor and the first input transistor. The second RF amplification circuit is also configured to amplify the RF signal but is coupled to the cascode amplifier stage between the first input transistor and the first cascode amplifier transistor. The second RF amplification circuit may also be a single stage or multistage RF amplification circuit. Furthermore, it should be noted that the RF amplification device may include any number of additional RF amplification circuits for operation in other power modes or to amplify RF signals in other RF communication bands.

The RF amplification device also includes power control circuitry configured to power the first RF amplification circuit and the second RF amplification circuit. The power control circuitry may include any type of circuitry configured to provide and control power to the first RF amplification circuit and the second RF amplification circuit. For instance, the power control circuitry may include RF switching converters, voltage regulation circuits, bias control circuits, and/or the like. The power control circuitry may also include digital or analog control circuitry for controlling the operation of these components. The power control circuitry is operable in the first power mode and the second power mode. In the first power mode (e.g., a high power mode), the power control circuitry is configured to bias the first RF amplification circuit so that the first RF amplification circuit is activated and to bias the second RF amplification circuit so that the second RF amplification circuit is deactivated. As such, the power control circuitry is configured to bias the first cascode output transistor of the cascode amplifier stage in a saturation region so that the cascode amplifier stage amplifies the RF signal.

In the second power mode (e.g., a medium power mode), the power control circuitry is configured to bias the first RF amplification circuit so that the first RF amplification circuit is deactivated and to bias the second RF amplification circuit so that the second RF amplification circuit is activated. In order to output the RF signal, the power control circuitry is configured to bias the first cascode output transistor of the cascode amplifier stage in a triode region so that the first cascode output transistor operates like a switch that is turned on. In this manner, a load presented by the first RF amplification circuit to the second RF amplification circuit is reduced when the second RF amplification circuit is active. The use of the cascode amplifier stage in both the first power mode and the second power mode also allows for the first RF amplification circuit and the second RF amplification circuit to be co-designed and provided with matching networks that ameliorate loading effects and prevent degradations in the performance of the RF amplification device due to having multiple RF amplification circuits. Furthermore, it should be noted that the power control circuitry may power any number of additional RF amplification circuits for operation in other power modes or that amplify RF signals in other RF communication bands.

FIG. 1 illustrates an embodiment of an RF amplification device 10. The RF amplification device 10 includes a first RF amplification circuit 12, a second RF amplification circuit 14, power control circuitry 16, input terminus 18, input matching network 20, output matching network 22, an intermediary matching network 24, and an output terminus 26. As explained in further detail below, the power control circuitry 16 is operable in a first power mode and in a second power mode. An RF signal 28 is input into the RF amplification device 10 at the input terminus 18 and is output after amplification at the output terminus 26. Both the first RF amplification circuit 12 and the second RF amplification circuit 14 are configured to amplify the RF signal. When the first RF amplification circuit 12 is activated in the first power mode, the input matching network 20 outputs the RF signal 28 at a matching network output terminus 30. The first RF amplification circuit 12 is provided in a first signal path 32 that is connected from the matching network output terminus 30 to the output terminus 26 of the RF amplification device 10. The output matching network 22 is also provided in the first signal path 32 to receive the RF signal 28 after amplification. The first signal path 32 thus extends from the matching network output terminus 30 to the output terminus 26. When the second RF amplification circuit 14 is activated in the second power mode, the input matching network 20 outputs the RF signal 28 at a matching network output terminus 34. The second RF amplification circuit 14 is provided in a second signal path 36. The second signal path 36 thus extends from the matching network output terminus 34 to a node 38 in the first RF amplification circuit 12, as explained in further detail below. The intermediary matching network 24 is also provided in the second signal path 36 between the second RF amplification circuit 14 and the node 38.

The first RF amplification circuit 12 shown in FIG. 1 is a multistage amplification circuit. However, it should be noted that in alternative embodiments, the first RF amplification circuit 12 may be a single stage amplification circuit. In this embodiment, the first RF amplification circuit 12 includes a plurality of RF amplifier stages (referred to generically as element 40, and specifically as elements 40A-40C) coupled in cascade. The RF amplifier stages 40 are coupled within the first signal path 32 so as to amplify the RF signal 28 as the RF signal 28 propagates along the first signal path 32. In other words, by being coupled in cascade, the RF amplifier stages 40 provide amplification to the RF signal 28 in sequence.

The first RF amplification circuit 12 shown in FIG. 1 has an initial RF amplifier stage 40A, an intermediate RF amplifier stage 40B, and a final RF amplifier stage 40C. However, other embodiments of the first RF amplification circuit 12 may include any number of RF amplifier stages 40 greater than or equal to one. The initial RF amplifier stage 40A is the RF amplifier stage 40 at a beginning of the sequence within the first signal path 32. The final RF amplifier stage 40C is the RF amplifier stage 40 at an end of the sequence within the first signal path 32. In the embodiment illustrated in FIG. 1, the first RF amplification circuit 12 has three RF amplifier stages 40. Thus, the single intermediate RF amplifier stage 40B is coupled within the first signal path 32 in cascade between the initial RF amplifier stage 40A and the final RF amplifier stage 40C. However, as mentioned above, the number of RF amplifier stages 40 may be any integer greater than or equal to one, and thus the number of RF amplifier stages 40 may be greater than three (3). As such, there may be any number of intermediate RF amplifier stages, like the intermediate RF amplifier stage 40B, coupled in cascade between the initial RF amplifier stage 40A and the final RF amplifier stage 40C.

Since the RF amplifier stages 40 are coupled in cascade within the first signal path 32, the RF amplifier stages 40 provide amplification to the RF signal 28 in sequence as the RF signal 28 propagates along the first signal path 32. Accordingly, the RF amplifier stage 40A initially provides amplification to the RF signal 28 in accordance with an amplifier gain $G_{initial}$. Once the RF signal 28 is amplified by the initial RF amplifier stage 40A in accordance with the amplifier gain $G_{initial}$, the intermediate RF amplifier stage 40B amplifies the RF signal 28 in accordance with an amplifier gain $G_{intermediate}$. Once the RF signal 28 is amplified by the intermediate RF amplifier stage 40B in accordance with the amplifier gain $G_{intermediate}$, the final RF amplifier stage 40C amplifies the RF signal 28 in accordance to an amplifier gain $G_{final}$. As such, an amplifier gain $G_{AMP}$ of the first RF amplification circuit 12 is an aggregated amplifier gain (i.e., $G_{initial}*G_{intermediate}*G_{final}$) of the plurality of RF amplifier stages 40.

As shown in FIG. 1, the initial RF amplifier stage 40A has an amplifier input terminus 42A and an amplifier output terminus 44A. The intermediate RF amplifier stage 40B has an amplifier input terminus 42B and an amplifier output terminus 44B. The final RF amplifier stage 40C has an amplifier input terminus 42C and an amplifier output terminus 44C. In this embodiment, the first RF amplification circuit 12 is illustrated as receiving the RF signal 28 as a single-ended signal. The first signal path 32 is thus a single-end signal path, and each of the RF amplifier stages 40 are single-ended RF amplifier stages. Thus, the amplifier input termini 42A, 42B, 42C, and the amplifier output termini 44A, 44B, 44C may each be a single-ended terminal or node. However, in alternative embodiments, the RF signal 28 may be received as a differential signal, and the first signal path 32 may be a differential signal path. As such, in these alternative embodiments, the RF amplifier stages 40 would be differential RF amplifier stages. Thus, the amplifier input termini 42A, 42B, 42C, and the amplifier output termini 44A, 44B, 44C may each be a pair of terminals or nodes configured to receive and/or transmit differential signals.

The first signal path 32 defined by the first RF amplification circuit 12 begins at the input terminus 18. As such, the first RF amplification circuit 12 is configured to receive the RF signal 28 from upstream RF circuitry at the input terminus 18. The amplifier input terminus 42A is provided within the first signal path 32 and is coupled to the matching network output terminus 30 to receive the RF signal 28 from the input matching network 20. As such, the RF signal 28 propagates along the first signal path 32 to the amplifier input terminus 42A of the initial RF amplifier stage 40A. The initial RF amplifier stage 40A is configured to amplify the RF signal 28 in accordance with the amplifier gain $G_{initial}$. Once the initial RF amplifier stage 40A has provided amplification to the RF signal 28 in accordance with the amplifier gain $G_{initial}$, the initial RF amplifier stage 40A transmits the RF signal 28 from the amplifier output terminus 44A, which is within the first signal path 32. The RF signal 28 then propagates from the amplifier output terminus 44A of the initial RF amplifier stage 40A along the first signal path 32. The intermediate RF amplifier stage 40B is configured to receive the RF signal 28 at the amplifier input terminus 42B, which is also within the first signal path 32. Once the intermediate RF amplifier stage 40B amplifies the RF signal 28 in accordance with the amplifier gain $G_{intermediate}$, the intermediate RF amplifier stage 40B transmits the RF signal 28 from the amplifier output terminus 44B. The amplifier output terminus 44B is in the first signal path 32. Thus, the RF signal 28 propagates from the amplifier output terminus 44B of the intermediate RF amplifier stage 40B along the first signal path 32. The final RF amplifier stage 40C then receives the RF signal 28 at the amplifier input terminus 42C, which is also within the first signal path 32. The final RF amplifier stage 40C amplifies the RF signal 28 in accordance with the amplifier gain $G_{final}$. Once the final RF amplifier stage 40C has provided amplification to the RF signal 28 in accordance with the amplifier gain $G_{final}$, the final RF amplifier stage 40C transmits the RF signal 28 from the amplifier output terminus 44C to the output matching network 22. The amplifier output terminus 44C is within the first signal path 32. The RF signal 28 then propagates from the amplifier output terminus 44C of the final RF amplifier stage 40C along the first signal path 32 to the output matching network 22 and then the output terminus 26. The RF signal 28 may then be transmitted by the output terminus 26 to downstream RF circuitry. Thus, the output terminus 26 is at an end of the first signal path 32 defined by the first RF amplification circuit 12.

To provide power for amplification, each of the RF amplifier stages 40 receives a supply voltage Vsupply. The power provided by the supply voltage Vsupply is then transferred to the RF signal 28 by each of the RF amplifier stages 40 in accordance with its respective amplifier gain, $G_{initial}$, $G_{intermediate}$, and $G_{final}$. However, note that as the RF signal 28 progresses through the sequence, each of the RF amplifier stages 40 handles an increasing amount of power. Therefore, the initial RF amplifier stage 40A handles the least amount of power, since it receives the RF signal 28 prior to amplification and transmits the RF signal 28 amplified only in accordance with the amplifier gain $G_{initial}$. When the intermediate RF amplifier stage 40B receives the RF signal 28, the RF signal 28 has already been amplified by the amplifier gain $G_{initial}$. The intermediate RF amplifier stage 40B further amplifies the RF signal 28 in accordance with the amplifier gain $G_{intermediate}$. Thus, the intermediate RF amplifier stage 40B transmits the RF signal 28 amplified in accordance with the amplifier gain $G_{initial}*G_{intermediate}$. As a result, the intermediate RF amplifier stage 40B handles an intermediate amount of power. The final RF amplifier stage 40C receives the RF signal 28 amplified in accordance with the aggregate amplifier gain $G_{initial}*G_{intermediate}$. As such, when the final RF amplifier stage 40C further amplifies the RF signal 28 by the amplifier gain $G_{final}$, the final RF amplifier stage 40C transmits the RF signal 28 amplified in accordance with the aggregate amplifier gain of $G_{initial}*G_{intermediate}*G_{final}$. As such, the final RF amplifier stage 40C handles the most power.

Each RF amplifier stage 40 is configured to provide amplification so that it may handle the appropriate power levels. For example, the RF amplifier stages 40 may include a transistor, a network of transistors, op-amps, and/or any other type of suitable RF amplification component. Often, the initial RF amplifier stage 40A and the intermediate RF amplifier stage 40B are classified as "driver" RF amplifier stages 40. In some embodiments, each of the driver RF amplifier stages 40 may have a single transistor or a pair of transistors to provide amplification. However, since the final RF amplifier stage 40C handles the most power, some embodiments of the final RF amplifier stage 40C may include arrays of transistors or stacks of transistors in order to handle the power levels seen by the final RF amplifier stage 40C.

The first RF amplification circuit 12 includes a cascode amplifier stage 46 configured to amplify the RF signal 28. In this embodiment, the cascode amplifier stage 46 is the final RF amplifier stage 40C. In alternative single stage embodiments of the first RF amplification circuit 12, no driver RF amplifier stages 40A and 40B are provided but the cascode amplifier stage 46. As shown in FIG. 1, the cascode amplifier stage 46 includes a first input transistor 48, a first cascode intermediary transistor 50, and a first cascode output transistor 52. The first input transistor 48, the first cascode intermediary transistor 50, and the first cascode output transistor 52 are stacked in cascode. Since the cascode amplifier stage 46 include the first cascode intermediary transistor 50 stacked in cascode between the first input transistor 48 and the first cascode output transistor 52, the cascode amplifier stage 46 has a double cascode topology. It should be noted that in alternative embodiments, the cascode amplifier stage 46 may have a single cascode topology where the first cascode intermediary transistor 50 is not provided. In alternative embodiments, additional cascode intermediary transistors in addition to the first cascode intermediary transistor 50 may be stacked in cascode between the first input transistor 48 and the first cascode output transistor 52. The first input transistor 48, the first cascode intermediary transistor 50, and the first cascode output transistor 52 are each provided as a field effect transistor (FETs). More specifically, the first input transistor 48, the first cascode intermediary transistor 50, and the first cascode output transistor 52 are each N-channel metal oxide semiconductor field effect transistors (MOSFETs). However, in alternative embodiments, other types of transistors may be used to form the cascode amplifier stage 46, such as bipolar junction transistors, other types of FETs, P-channel FETs, and/or the like.

Referring again to FIG. 1, the first input transistor 48 includes a gate GIT1, a source SIT1, and a drain DIT1. The first input transistor 48 is a common source transistor of the cascode amplifier stage 46. More specifically, the gate GIT1 is connected to the amplifier input terminus 42C to input the RF signal 28 into the cascode amplifier stage 46 after amplification by the intermediate RF amplifier stage 40B. The source SIT1 is coupled to ground. The RF signal 28 is output from the drain DIT1 of the first input transistor 48. The first cascode intermediary transistor 50 has a gate GNT1, a source SNT1, and a drain DNT1. The first cascode intermediary transistor 50 is provided as a common source transistor. The gate GNT1 is a control terminal that receives a transistor control voltage TCV1 from the power control circuitry 16, as explained in further detail below. The first cascode output transistor 52 has a gate GOT1, a source SOT1, and a drain DOT1. The source SOT1 is connected to the node 38 to receive the RF signal 28, and the drain DOT1 is connected to the amplifier output terminus 44C to output the RF signal 28 to the output matching network 22. The drain DOT1 is a supply terminal to receive the supply voltage Vsupply from the power control circuitry 16. The gate GOT1 is a control terminal that receives a transistor control voltage TOV1 from the power control circuitry 16, as explained in further detail below.

The second RF amplification circuit 14 includes the amplifier stage 54. In this embodiment, the second RF amplification circuit 14 is a single stage amplification circuit and thus only includes the amplifier stage 54. In alternative embodiments, the second RF amplification circuit 14 is a multistage amplification circuit. As shown in FIG. 1, the amplifier stage 54 includes an amplifier input terminus 56 connected to the matching network output terminus 34 to input the RF signal 28 into the amplifier stage 54 and an amplifier output terminus 58 that outputs the RF signal 28 from the amplifier stage 54 after amplification. The second RF amplification circuit 14 is provided within the second signal path 36. The second RF amplification circuit 14 is also coupled to the cascode amplifier stage 46 between the first input transistor 48 and the first cascode output transistor 52. In this embodiment, the intermediary matching network 24 is provided in the second signal path 36 between the second RF amplification circuit 14 and the node 38. More specifically, the intermediary matching network 24 is provided in the second signal path 36 so as to be connected between the amplifier output terminus 58 and the node 38. The node 38 is located between the first cascode intermediary transistor 50 and the first cascode output transistor 52. As a result, the second RF amplification circuit 14 is also coupled to the cascode amplifier stage 46 between the first cascode intermediary transistor 50 and the first cascode output transistor 52.

The power control circuitry 16 is operable in a first power mode and a second power mode. The power control circuitry 16 is configured to bias the first RF amplification circuit 12 so that the first RF amplification circuit 12 is activated in the first power mode and bias the second RF amplification circuit 14 so that the second RF amplification circuit 14 is deactivated in the first power mode. For the second power mode, the power control circuitry 16 is configured to bias the second RF amplification circuit 14 so that the second RF amplification circuit 14 is activated in the second power mode and bias the first RF amplification circuit 12 so that the first RF amplification circuit 12 is deactivated in the second power mode.

In the embodiment shown in FIG. 1, the first RF amplification circuit 12 is configured to operate at higher power levels than the second RF amplification circuit 14 such that the first power mode is a higher power mode than the second power mode, the first power mode is a high power mode, and the second power mode is a medium power mode. Also, the first RF amplification circuit 12 is a high power amplifier while the second RF amplification circuit 14 is a medium power amplifier. Accordingly, in the first power mode (e.g., the high power mode), the first RF amplification circuit 12 is activated by the power control circuitry 16, and the first RF amplification circuit 12 amplifies the RF signal 28 while the second RF amplification circuit 14 is deactivated. The first RF amplification circuit 12 thus amplifies the RF signal 28 when more power is required. The RF signal 28 thus propagates along the first signal path 32 from the matching output terminus 30 to the output terminus 26.

In the second power mode (e.g., the medium power mode), the second RF amplification circuit 14 is activated by the power control circuitry 16, and the second RF amplification circuit 14 amplifies the RF signal 28 while the first RF amplification circuit 12 is deactivated. The second RF amplification circuit 14 thus amplifies the RF signal 28 when less power is required. The RF signal 28 thus propagates along the second signal path 36 from the matching network output terminus 34 to the cascode amplifier stage 46 at the node 38. In the second power mode, the RF signal 28 then propagates from the node 38 through the first cascode output transistor 52 and to the output terminus 26.

The power control circuitry 16 may provide and control power to the first RF amplification circuit 12 and the second RF amplification circuit 14. For instance, the power control circuitry 16 may include RF switching converters, voltage regulation circuits, bias control circuits, charge pumps, and/or the like. The power control circuitry may also include digital or analog control circuitry for controlling the operation of these components. The power control circuitry 16 is configured to generate a control output 60 to provide power to the first RF amplification circuit 12 and the second RF amplification circuit 14. The control output 60 may include any number of voltage signals or current signals to bias the first RF amplification circuit 12 and the second RF amplification circuit 14. For example, in this embodiment, the control output 60 may include the supply voltage Vsupply, the transistor control voltage TCV1, and the transistor control voltage TOV1. The control output 60 may also include other signals, such as other supply voltages and operational bias input signals that are provided at the amplifier input termini 42A-42C, 56. To bias the RF amplifier stages 40A-40C, 54 so that the RF amplifier stages 40A-40C, 54 are activated, the power control circuitry 16 generates the control output 60 so that the RF signal 28 has a quiescent operating level within the operating range of the RF amplifier stages 40A-40C, 54. To bias the RF amplifier stages 40A-40C, 54 so that the RF amplifier stages 40A-40C, 54 are deactivated, the power control circuitry 16 generates the control output 60 so that the RF signal 28 has a quiescent operating level well below the operating range of the RF amplifier stages 40A-40C, 54.

The power control circuitry 16 is also configured to receive a control input 62. The control input 62 may include one or more analog and/or digital signal to indicate operational modes, such as the first power mode and the second power mode. The control input 62 may also indicate frequency information related to the RF signal 28 and information related to the RF communication standard of the RF signal 28. The power control circuitry 16 is configured to generate the supply voltage Vsupply from a power source voltage VP, such as a battery voltage. The control input 62 may also include control information regarding a target voltage level of the supply voltage Vsupply. For example, the supply voltage Vsupply may be modulated. In this manner, the power control circuitry 16 may switch to a different operational mode in accordance to the control input 62, including the first power mode and the second power mode. Note that the power control circuitry 16 may generate various supply voltages from the power source voltage VP, in addition to the supply voltage Vsupply, and provide them to the various RF amplifier stages 40, 54.

With regard to the cascode amplifier stage 46, the power control circuitry 16 is configured to bias the cascode amplifier stage 46 so that the cascode amplifier stage 46 is activated in the first power mode. Accordingly, the power control circuitry 16 is configured to bias the first cascode output transistor 52 so that the first cascode output transistor 52 operates in a saturation region in the first power mode. The power control circuitry 16 is also configured to bias the first cascode intermediary transistor 50 so that the first cascode intermediary transistor 50 operates in a saturation region in the first power mode. The power control circuitry 16 is also configured to bias the first input transistor 48 so that the RF signal 28 is biased within an operational region of the cascode amplifier stage 46 when received at the amplifier input terminus 42C. To do this, the power control circuitry 16 generates the transistor control voltage TOV1 at a voltage level that sets the first cascode output transistor 52 in the saturation region. The power control circuitry 16 generates the transistor control voltage TCV1 at a voltage level that sets the first cascode intermediary transistor 50 in the saturation region. Furthermore, the power control circuitry 16 may generate a gate bias signal that is applied to the RF signal 28 at the amplifier input terminus 42C so that the RF signal 28 is input within the operational region of the cascode amplifier stage 46. In the first power mode, the first input transistor 48 operates as a transconductance amplifier while the first cascode output transistor 52 and the first cascode intermediary transistor 50 operate as current buffers. This eliminates or at least ameliorates the Miller effect. The power control circuitry 16 is also configured to bias the initial RF amplifier stage 40A and the intermediary RF amplifier stage 40B so that the initial RF amplifier stage 40A and the intermediary RF amplifier stage 40B are activated in the first power mode. However, the power control circuitry is configured to bias the second RF amplification circuit 14 so that the second RF amplification circuit 14 is deactivated in the first power mode.

The power control circuitry is configured to bias the second RF amplification circuit 14 so that the second RF amplification circuit 14 is activated in the second power mode. With regard to the cascode amplifier stage 46, the power control circuitry 16 is configured to bias the cascode amplifier stage 46 so that the cascode amplifier stage 46 is deactivated in the second power mode. However, the power control circuitry 16 is configured to bias the first cascode output transistor 52 so that the first cascode output transistor 52 operates in a triode region in the second power mode. Thus, the first cascode output transistor 52 operates as a switch that has been turned on (i.e. a closed switch). As such, in the second power mode, the RF signal 28 is amplified by the second RF amplification circuit 14 in the second signal path 36 and then is propagated through the first cascode output transistor 52 to the output terminus 26. To do this, the power control circuitry 16 generates the transistor control voltage TOV1 at a voltage level that sets the first cascode output transistor 52 in the triode region.

The power control circuitry 16 is also configured to bias the first cascode intermediary transistor 50 so that the first cascode intermediary transistor 50 is turned off in the second power mode. The power control circuitry 16 is also configured to bias the first input transistor 48 so that the first input transistor 48 biased is turned off and below an operational region of the cascode amplifier stage 46 when received at the amplifier input terminus 42C. The power control circuitry 16 generates the transistor control voltage TCV1 at a voltage level that sets the first cascode intermediary transistor 50 is approximately at ground. In this manner, the first cascode intermediary transistor 50 is turned off to cut off current and also to provide a high impedance to the first cascode output transistor 52 and the second signal path 36. Furthermore, the power control circuitry 16 may generate the gate bias signal applied to the RF signal 28 at the amplifier input terminus 42C so that the RF signal 28 is input below the operational region of the cascode amplifier stage 46. Furthermore, the power control circuitry 16 is also configured to bias the initial RF amplifier stage 40A and the intermediary RF amplifier stage 40B so that the initial RF amplifier stage 40A and the intermediary RF amplifier stage 40B are deactivated in the second power mode.

The input matching network 20 inputs the RF signal 28 from external upstream circuitry into the RF amplification device 10. The input matching network 20 provides the RF signal 28 to the first RF amplification circuit 12 and the second RF amplification circuit 14 while maintaining good input impedance matching in both the first power mode and the second power mode. More specifically, a source impedance (e.g., output impedance of the upstream circuitry) is presented to the input matching network 20 at the input terminus 18. The first RF amplification circuit 12 is connected to the input matching network 20 such that an input impedance of the first RF amplification circuit 12 is presented to the input matching network 20 at the matching output terminus 30. The input matching network 20 is configured to substantially match the source impedance presented at the input terminus 18 and the first input impedance of the first RF amplification circuit 12 as presented at the matching network output terminus 30 when the power control circuitry 16 is in the first power mode. The second RF amplification circuit 14 is connected to the input matching network 20 such that an input impedance of the second RF amplification circuit 14 is presented to the input matching network 20 at the matching network output terminus 34. To provide appropriate matching to the source impedance in both the first power mode and the second power mode, the input matching network 20 is also configured to substantially match the source impedance presented at the input terminus 18 and the input impedance of the second RF amplification circuit 14 as presented at the matching network output terminus 30 when the power control circuitry 16 is in the second power mode.

The output matching network 22 is provided in the first signal path 32 so as to receive the RF signal 28 from the first cascode output transistor 52. Note that the output matching network 22 receives the RF signal 28 in both the first power mode and the second power mode since the RF signal 28 is output at the amplifier output terminus 44C in both the first power mode and the second power mode. Thus, the output matching network 22 is coupled to receive the first RF amplification circuit 12 in the first power mode and the second RF amplification circuit 14 in the second power mode. The output matching network 22 is also coupled to the output terminus 26 so as to output the RF signal 28 to external downstream circuitry after amplification by the RF amplification device 10. As such, an output matching network 22 is operable to output the RF signal such that a load impedance (e.g., an input impedance of the downstream circuitry) is presented to the output matching network 22 at the output terminus 26. An output impedance of the cascode amplifier stage 46 is presented to the output matching network 22 at the amplifier output terminus 44C. The output matching network 22 is configured to substantially match the load impedance presented at the output terminus 26 and the output impedance of the cascode amplifier stage 46 as presented at the amplifier output terminus 44C.

The intermediary matching network 24 is provided in the second signal path 36 between the amplifier output terminus 58 of the second RF amplification circuit 14 and the node 38 of the cascode amplifier stage 46. An output impedance of the second RF amplification circuit 14 is thus presented to the intermediary matching network 24 while a cascode amplifier input impedance is presented to the intermediary matching network 24 at the node 38. In order to provide output impedance matching when the second RF amplification circuit 14 is activated and the first RF amplification circuit 12 is deactivated, the intermediary matching network 24 is configured to substantially match the output impedance of the second RF amplification circuit 14 to the cascode amplifier input impedance presented at the node 38 while the power control circuitry 16 is in the second power mode.

To prevent or reduce distortion from the second signal path 36 while the first RF amplification circuit 12 is activated while in the first power mode, a switch device 64 is coupled in shunt to the second signal path 36 between the amplifier output terminus 58 of the second RF amplification circuit 14 and the intermediary matching network 24. The switch device 64 is operable to be opened and closed. The power control circuitry 16 is further configured to operate the switch device 64 in the first power mode so that the switch device 64 is open and operate the switch device 64 in the second power mode so that the switch device is closed. In FIG. 1, the power control circuitry 16 is in the second power mode (e.g., the medium power mode), and therefore the switch device 64 is open, and the first cascode output transistor 52 is biased in the triode region to operate as a closed switch. Thus, the RF signal 28 is shown propagating through the second signal path 36 to the node 38 then through the first cascode output transistor 52 to the output terminus 26. The first RF amplification circuit 12 has been deactivated while the second RF amplification circuit 14 is activated by the power control circuitry 16. Thus, the second RF amplification circuit 14 amplifies the RF signal 28.

Figure 2:
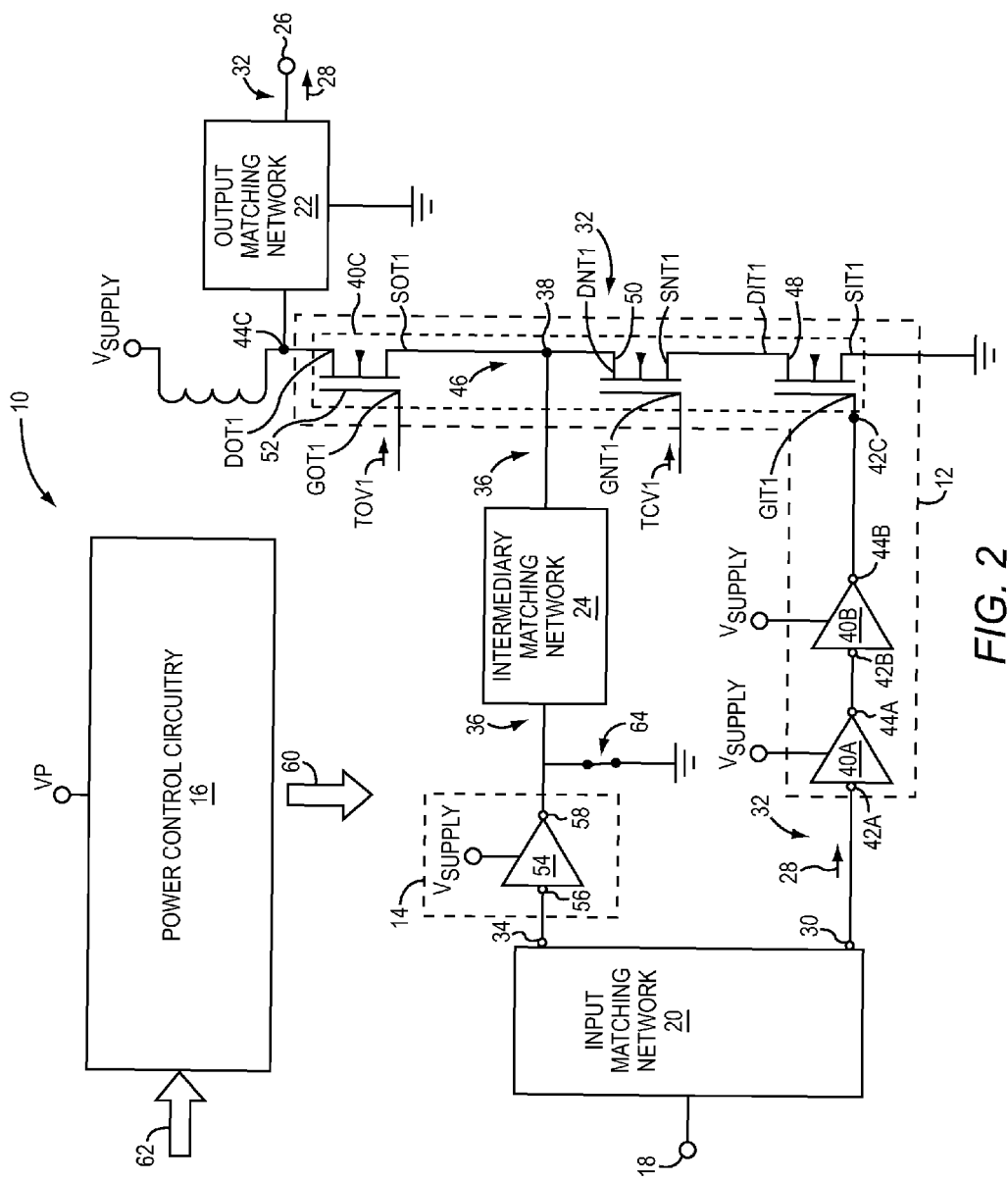
FIG. 2 illustrates the RF amplification device shown in FIG. 1 with the switch device closed in the first power mode.

FIG. 2 illustrates the power control circuitry 16 is in the first power mode (e.g., the first power mode), and therefore the switch device 64 is closed, and the first cascode output transistor 52 is biased in the saturation region to operate as a current buffer. The first RF amplification circuit 12 has been activated while the second RF amplification circuit 14 is deactivated by the power control circuitry 16. Thus, the first RF amplification circuit 12 amplifies the RF signal 28. The RF signal 28 propagates through the first signal path 32.

Figure 3:
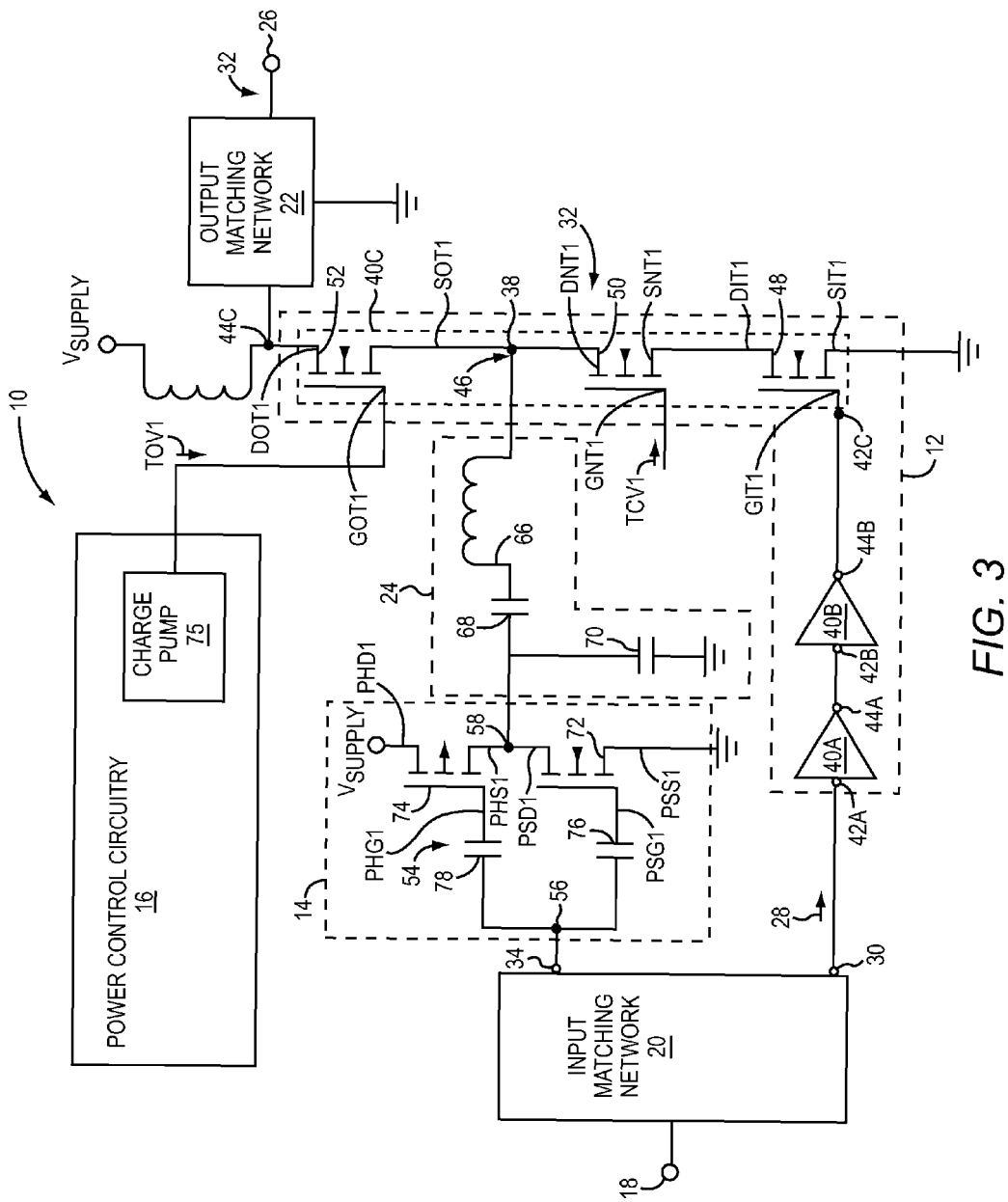
FIG. 3 illustrates another embodiment of the RF amplification device shown in FIG. 1 where the second RF amplification circuit is provided with a push pull amplifier stage.

FIG. 3 illustrates the RF amplification device 10 shown in FIG. 1 with a particular embodiment of the intermediary matching network 24 and a particular embodiment of the amplifier stage 54 in the second RF amplification circuit 14. The intermediary matching network 24 includes an inductor 66, a capacitor 68 connected in series with the inductor 66, and a capacitor 70 coupled in shunt to the second RF amplification circuit 14. The inductor 66 and the capacitor 68 are also coupled to the second RF amplification circuit 14 and coupled to the cascode amplifier stage 46 at the first node 38 between the first cascode output transistor 52 and the first input transistor 48. The intermediary matching network 24 thus forms a low-pass network that provides an impedance transformation to match the cascode amplifier input impedance presented at the node 38 to the output impedance of the second RF amplification circuit 14.

In FIG. 3, the amplifier stage 54 is a push pull amplifier stage that includes a push transistor 72 and a pull transistor 74. In this embodiment, the push transistor 72 is an N-channel MOSFET, and the pull transistor 74 is a P-channel MOSFET. The push transistor 72 thus includes a gate PSG1, a drain PSD1, and a source PSS1. The drain PSD1 is connected to the amplifier output terminus 58, which in this example is provided as a node. The source PSS1 is connected to ground. The push transistor 72 includes a gate PHG1, a drain PHD1, and a source PHS1. A capacitor 76 is coupled to the gate PSG1 and a capacitor 78 is coupled to the gate PHG1. A capacitor 76 and the capacitor 78 are each coupled to the amplifier input terminus 56, which in this embodiment is provided as a node. In the second power mode, the power control circuitry 16 is configured to bias the amplifier stage to operate as a push pull amplifier. However, in the first power mode, the power control circuitry 16 is configured to bias the pull transistor 74 so that the pull transistor 74 is turned off during the first power mode. Also, the power control circuitry 16 is configured to bias the push transistor 72 so that the push transistor 72 operates in a triode region in the second power mode and thus as a closed switch.

The push transistor 72 thus shorts the inductor 66 to ground while the capacitor 68 is placed in series with the inductor 66 to block DC current. This inductor 66 actually aids the operation of the first RF amplification circuit 12 in the first power mode because the inductor 66 resonates out part of the parasitic capacitance at the source SOT1 of the first cascode output transistor 52, hence reducing signal loss and increasing output power efficiency of the cascode amplifier stage 46 during the first power mode.

In this embodiment, the power control circuitry 16 includes a charge pump 75 that is configured to generate the transistor control voltage TOV1. The charge pump 75 is connected to the gate GOT1 of the first cascode output transistor 52. The gate GOT1 is thus biased by the transistor control voltage TOV1. In the second power mode, the power control circuitry 16 is configured to generate the transistor control voltage TOV1 so that the transistor control voltage TOV1 is greater than the power source voltage VP with the charge pump 75. In this manner, with the source SOT1 and the drain DOT1 of the first cascode output transistor 52 biased at the supply voltage Vsupply, the gate GOT1 is biased above the supply voltage Vsupply. This biasing is achieved by the charge pump 75, which pumps the transistor control voltage TOV1 above the supply voltage Vsupply.

Figure 4:
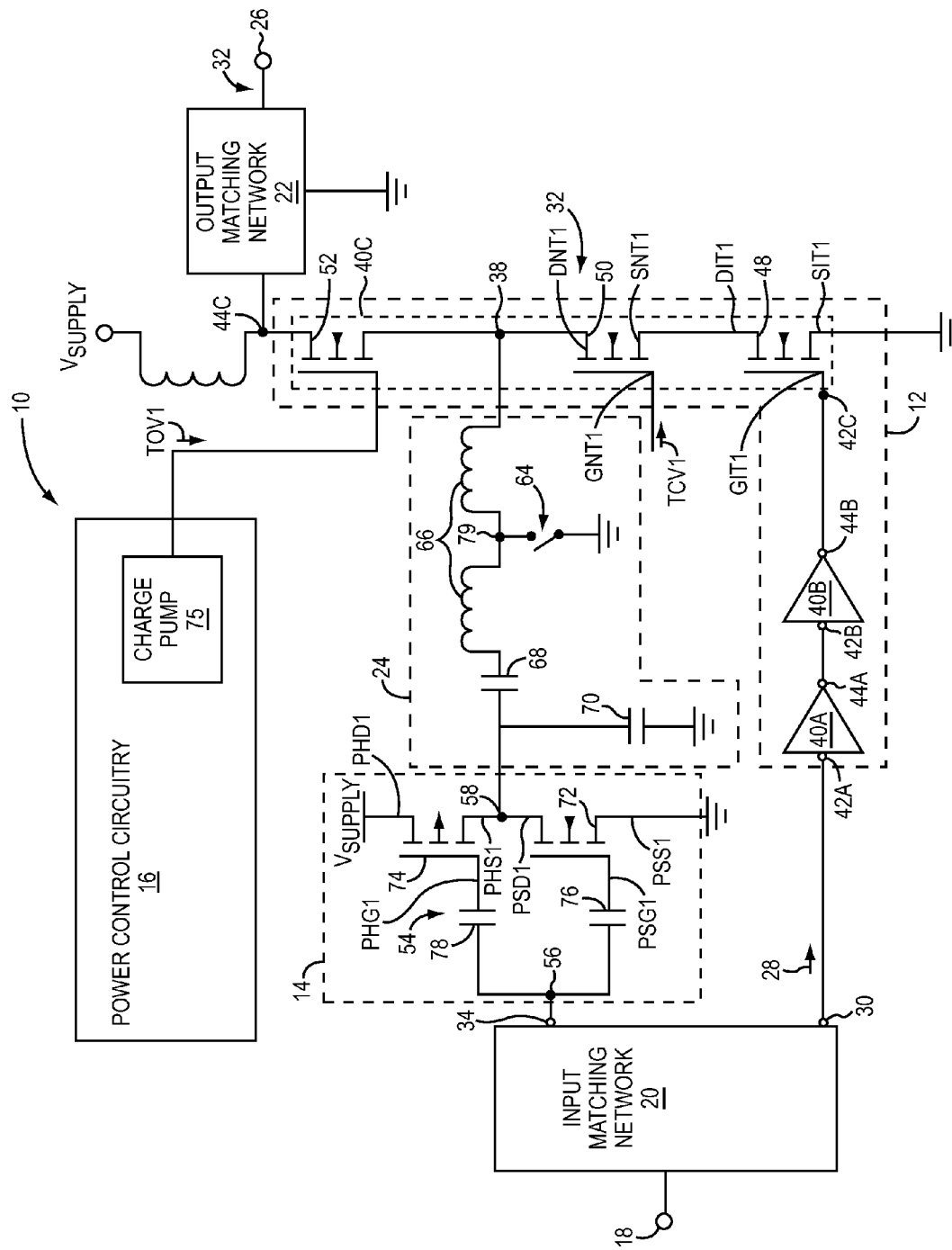
FIG. 4 illustrates another embodiment of the RF amplification device shown in FIG. 1 where the switch device is provided in an intermediary matching network.

FIG. 4 illustrates another embodiment of the RF amplification device 10 shown in FIG. 1. The RF amplification device 10 is the same as the RF amplification device 10 shown in FIG. 3, except in this embodiment, the switch device 64 is provided in the intermediary matching network 24. In this embodiment, the switch device 64 is coupled in shunt to an intermediate tap 79 of the inductor 66. The power control circuitry 16 is configured to operate the switch device 64 in the first power mode so that the switch device 64 is open and operate the switch device 64 in the second power mode so that the switch device 64 is closed. It should be noted that the intermediary matching network 24 may be any combination of passive elements, and a switch may be placed at its input or any intermediate point to reconfigure the network between the HP and MP modes. All such variations are considered to be within the scope of the present disclosure.

Figure 5:
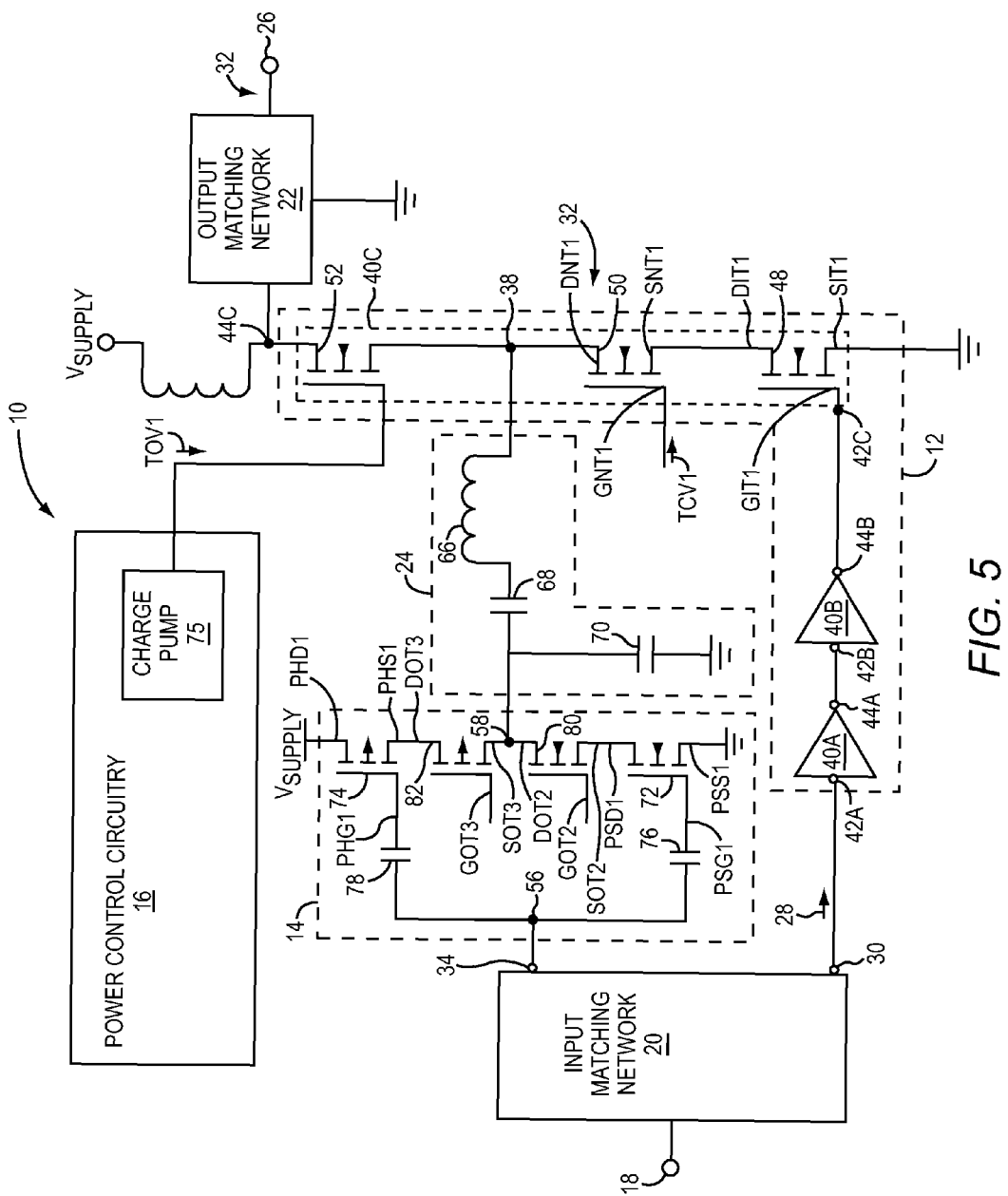
FIG. 5 illustrates another embodiment of the RF amplification device shown in FIG. 1 that includes a push pull amplifier stage similar to the push pull amplifier stage shown in FIG. 3 except the push pull amplifier stage has two additional cascode output transistors.

FIG. 5 illustrates another embodiment of the RF amplification device 10 shown in FIG. 1. In this embodiment, the second RF amplification circuit 14 and the amplifier stage 54 are also provided as a push-pull amplifier stage, similar to FIGS. 3 and 4. However, in this embodiment, a second cascode output transistor 80 and a third cascode output transistor 82 are provided. The push transistor 72 and the second cascode output transistor 80 are stacked in cascode. More specifically, the second cascode output transistor 80 has a source SOT2 coupled to the drain PSD1 of the push transistor 72, a drain DOT2 coupled to the amplifier output terminus 58, and a gate GOT2 that is biased by the power control circuitry 16. In this embodiment, the second cascode output transistor 80 is an N-channel MOSFET. Also, the pull transistor 74 and the third cascode output transistor 82 are stacked in cascode. More specifically, the third cascode output transistor 82 has a drain DOT3 coupled to the source PHS1 of the pull transistor 74, a source SOT3 coupled to the amplifier output terminus 58, and a gate GOT3 that is biased by the power control circuitry 16. In this embodiment, the third cascode output transistor 82 is a P-channel MOSFET. Also, the second cascode output transistor 80 and the third cascode output transistor 82 are stacked in cascode.

The push transistor 72 and the pull transistor 74 are biased by the power control circuitry 16 in the same manner described above with respect to FIG. 3 in the first power mode and the second power mode. In the first power mode, the power control circuitry is configured to bias the pull transistor 74 so that the pull transistor 74 is turned off, bias the third cascode output transistor 82 so that the pull transistor 74 is turned off, bias the push transistor 72 so that the push transistor 72 operates in a triode region as a closed switch, and bias the second cascode output transistor 80 so that the second cascode output transistor 80 operates in a triode region as a closed switch. In the second power mode, the power control circuitry 16 is configured to bias the pull transistor 74 so that the pull transistor 74 operates in a saturation region, bias the second cascode output transistor 80 so that the second cascode output transistor 80 operates in a saturation region, bias the push transistor 72 so that the push transistor 72 operates in a saturation region, and bias the third cascode output transistor 82 so that the third cascode output transistor 82 operates in a saturation region.

Figure 6:
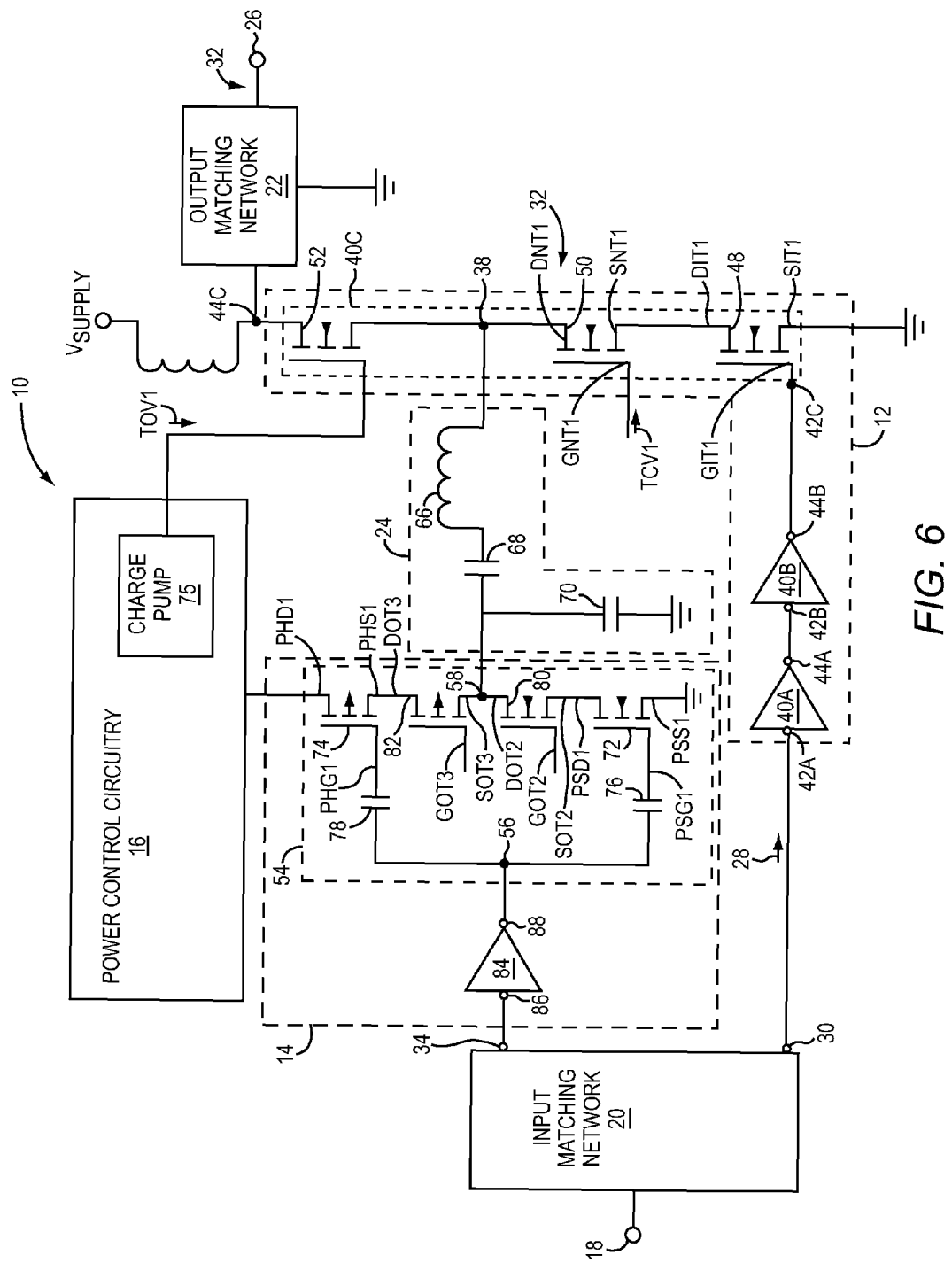
FIG. 6 illustrates another embodiment of the RF amplification device shown in FIG. 1 that is similar to the RF amplification device shown in FIG. 5 except the second RF amplification circuit further includes a driver amplifier stage.

FIG. 6 illustrates another embodiment of the RF amplification device 10 shown in FIG. 1. The RF amplification device 10 shown in FIG. 6 is the same as the RF amplification device 10 shown in FIG. 5, except that in this embodiment, the second RF amplification circuit 14 includes a driver amplifier stage 84 that includes an amplifier input terminus 86 coupled to the matching network output terminus 34 and an amplifier output terminus 88 coupled to the amplifier input terminus 56 of the amplifier stage 54. In this example, the amplifier stage 54 is a final amplifier stage of the second RF amplification circuit 14.

Figure 7:
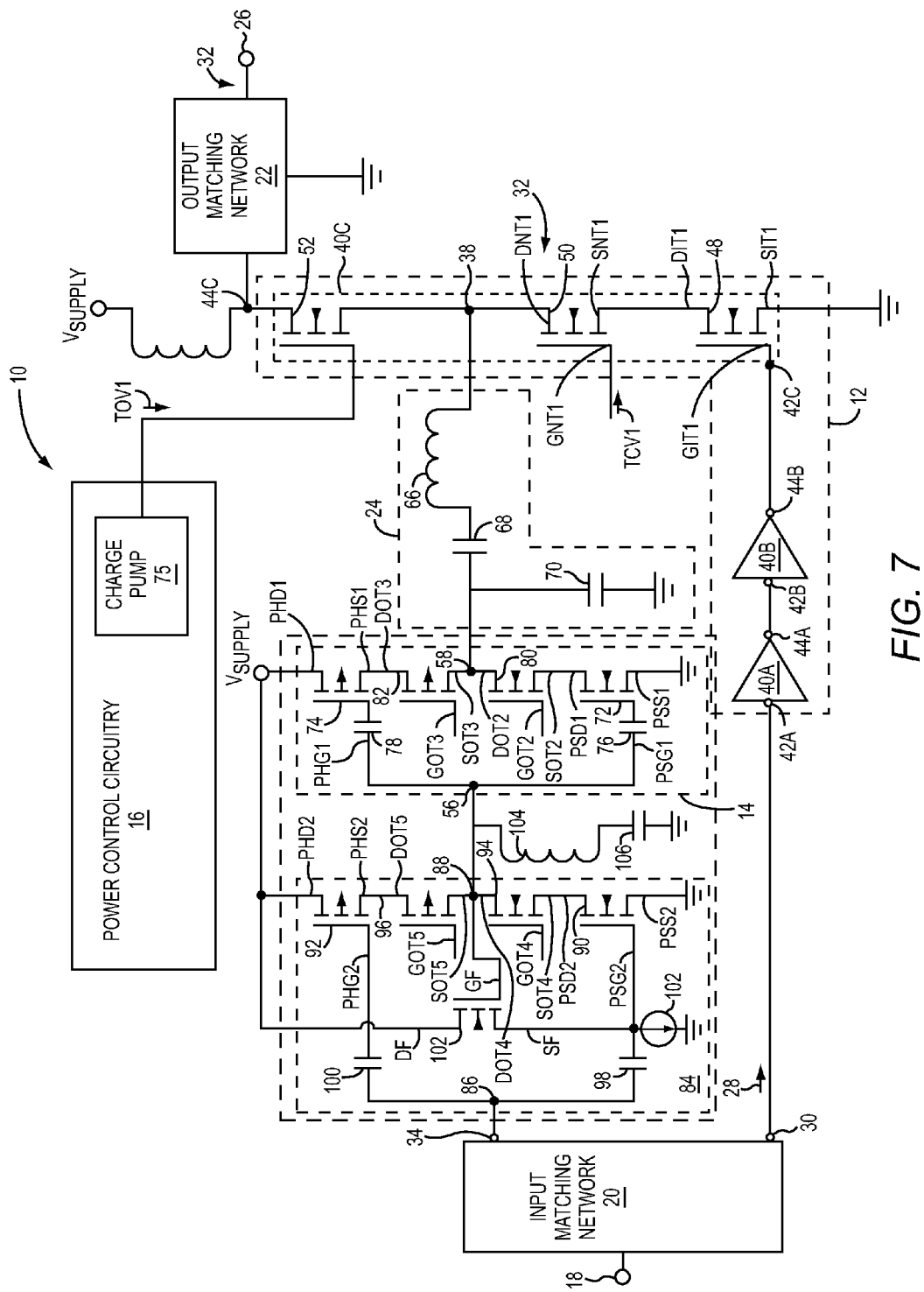
FIG. 7 illustrates another embodiment of the RF amplification device shown in FIG. 1 that is similar to the RF amplification device shown in FIG. 6 wherein an embodiment of the driver amplifier stage is illustrated.

In FIG. 7, the amplifier stage 84 is a push pull amplifier stage that includes a push transistor 90 and a pull transistor 92. In this embodiment, the push transistor 90 is an N-channel MOSFET, and the pull transistor 92 is a P-channel MOSFET. The push transistor 90 thus includes a gate PSG2, a drain PSD2, and a source PSS2. The drain PSD2 is connected to the amplifier output terminus 88, which in this example is provided as a node. The source PSS2 is connected to ground. The pull transistor 92 includes a gate PHG2, a drain PHD2, and a source PHS2. A capacitor 98 is coupled to the gate PSG2 and a capacitor 100 is coupled to the gate PHG2. A capacitor 98 and the capacitor 100 are each coupled to the amplifier input terminus 86, which in this embodiment is provided as a node. In the second power mode, the power control circuitry 16 is configured to bias the amplifier stage to operate as a push pull amplifier. However, in the first power mode, the power control circuitry 16 is configured to bias the pull transistor 92 so that the pull transistor 92 is turned off during the first power mode. Also, the power control circuitry 16 is configured to bias the push transistor 90 so that the push transistor 90 operates in a triode region in the second power mode and thus as a closed switch.

In this embodiment, the second RF amplification circuit 14 and the driver amplifier stage 84 are also provided as a push-pull amplifier stage, similar to the amplifier stage 54, which serves as the final amplifier stage in this embodiment. Accordingly, in this embodiment, a fourth cascode output transistor 94 and a fifth cascode output transistor 96 are provided. The push transistor 90 and the fourth cascode output transistor 94 are stacked in cascode. More specifically, the fourth cascode output transistor 94 has a source SOT4 coupled to the drain PSD2 of the push transistor 90, a drain DOT4 coupled to the amplifier output terminus 88, and a gate GOT4 that is biased by the power control circuitry 16. In this embodiment, the fourth cascode output transistor 94 is an N-channel MOSFET. Also, the pull transistor 92 and the fifth cascode output transistor 96 are stacked in cascode. More specifically, the fifth cascode output transistor 96 has a drain DOT5 coupled to the source PHS2 of the pull transistor 92, a source SOT5 coupled to the amplifier output terminus 88, and a gate GOT5 that is biased by the power control circuitry 16. In this embodiment, the fifth cascode output transistor 96 is a P-channel MOSFET. Also, the fourth cascode output transistor 94 and the fifth cascode output transistor 96 are stacked in cascode.

In the first power mode, the power control circuitry is configured to bias the pull transistor 92 so that the pull transistor 92 is turned off, bias the fifth cascode output transistor 96 so that the pull transistor 92 is turned off, bias the push transistor 90 so that the push transistor 90 operates in a triode region as a closed switch, and bias the fourth cascode output transistor 94 so that the fourth cascode output transistor 94 operates in a triode region as a closed switch. In the second power mode, the power control circuitry 16 is configured to bias the pull transistor 92 so that the pull transistor 92 operates in a saturation region, bias the fourth cascode output transistor 94 so that the fourth cascode output transistor 94 operates in a saturation region, bias the push transistor 90 so that the push transistor 90 operates in a saturation region, and bias the fifth cascode output transistor 96 so that the fifth cascode output transistor 96 operates in a saturation region.

Those skilled in the art will recognize improvements and modifications to the preferred embodiments of the present disclosure. All such improvements and modifications are considered within the scope of the concepts disclosed herein and the claims that follow.

What is claimed is:

1. A radio frequency (RF) amplification device comprising:
    a first RF amplification circuit comprising a cascode amplifier stage configured to amplify an RF signal, wherein the cascode amplifier stage has a first input transistor and a first cascode output transistor that are stacked in cascode;
    a second RF amplification circuit configured to amplify the RF signal, wherein the second RF amplification circuit is coupled to the cascode amplifier stage between the first input transistor, the first cascode output transistor, and a first cascode intermediary transistor stacked between the first input transistor and the first cascode output transistor; and
    power control circuitry operable in a first power mode and a second power mode, wherein the power control circuitry is configured to:
        bias the first cascode output transistor so that the first cascode output transistor operates in a saturation region in the first power mode;
        bias the first cascode intermediary transistor such that the first cascode intermediary transistor operates in the saturation region in the first power mode;
        bias the first cascode intermediary transistor so that the first cascode intermediary transistor is turned off in the second power mode; and
        bias the first cascode output transistor so that the first cascode output transistor operates in a triode region in the second power mode.

2. The RF amplification device of claim 1 wherein the power control circuitry is further configured to:
    bias the first RF amplification circuit so that the first RF amplification circuit is activated in the first power mode, wherein biasing the first RF amplification circuit so that the first RF amplification circuit is activated comprises biasing the first cascode output transistor so that the first cascode output transistor operates in the saturation region; and
    bias the second RF amplification circuit so that the second RF amplification circuit is activated in the second power mode.

3. The RF amplification device of claim 2 wherein:
    the first RF amplification circuit is configured to operate at higher power levels than the second RF amplification circuit such that the first power mode is a higher power mode than the second power mode.

4. The RF amplification device of claim 2 wherein:
    the first RF amplification circuit is a high power RF amplification circuit;
    the second RF amplification circuit is a medium power RF amplification circuit; and
    the power control circuitry is configured such that the first power mode is a high power mode and the second power mode is a medium power mode.

5. The RF amplification device of claim 2 wherein the power control circuitry is further configured to:
    bias the first RF amplification circuit so that the first RF amplification circuit is deactivated in the second power mode; and
    bias the second RF amplification circuit so that the second RF amplification circuit is deactivated in the first power mode.

6. The RF amplification device of claim 5 wherein the power control circuitry is further configured to bias the cascode amplifier stage so that the first input transistor is turned off in the second power mode.

7. The RF amplification device of claim 1 wherein:
    the second RF amplification circuit is coupled to the cascode amplifier stage between the first cascode intermediary transistor and the first cascode output transistor.

8. The RF amplification device of claim 7 further comprising a matching network coupled to the second RF amplification circuit and connected to the cascode amplifier stage between the first cascode intermediary transistor and the first cascode output transistor such that an output impedance of the second RF amplification circuit is and a cascode amplifier input impedance is presented to the matching network, wherein the matching network is configured to substantially match the output impedance of the second RF amplification circuit to the cascode amplifier input impedance while the power control circuitry is in the second power mode.

9. The RF amplification device of claim 1 wherein the first RF amplification circuit further comprises a plurality of amplifier stages coupled in cascade, wherein the plurality of amplifier stages includes the cascode amplifier stage.

10. The RF amplification device of claim 9 wherein:
the cascode amplifier stage is a final amplifier stage of the first RF amplification circuit; and
the plurality of amplifier stages includes a driver amplifier stage coupled in cascade with the final amplifier stage.

11. The RF amplification device of claim 1 further comprising an input matching network operable to input the RF signal such that a source impedance is presented to the input matching network wherein:
the first RF amplification circuit is connected to the input matching network such that a first input impedance of the first RF amplification circuit is presented to the input matching network;
the second RF amplification circuit is connected to the input matching network such that a second input impedance of the second RF amplification circuit is presented to the input matching network; and
the input matching network is configured to substantially match the source impedance and the first input impedance as presented when the power control circuitry is in the first power mode and to substantially match the source impedance and the second input impedance as presented when the power control circuitry is in the second power mode.

12. The RF amplification device of claim 1 wherein:
the first RF amplification circuit is provided in a first signal path;
the second RF amplification circuit is provided in a second signal path; and
the second signal path is connected to the cascode amplifier stage between the first input transistor and the first cascode output transistor.

13. The RF amplification device of claim 12 further comprising an output matching network operable to output the RF signal such that a load impedance is presented to the output matching network, wherein the output matching network is provided in the first signal path so as to receive the RF signal from the first cascode output transistor.

14. The RF amplification device of claim 12 further comprising an intermediary matching network provided in the second signal path between the second RF amplification circuit and the cascode amplifier stage.

15. The RF amplification device of claim 12 further comprising a switch device operable to be opened and operable to be closed, wherein the switch device is coupled in shunt to the second signal path and wherein the power control circuitry is further configured to:
operate the switch device in the first power mode so that the switch device is open; and
operate the switch device in the second power mode so that the switch device is closed.

16. The RF amplification device of claim 15 further comprising an intermediary matching network provided in the second signal path between the second RF amplification circuit and the cascode amplifier stage wherein the switch device is connected in shunt to the second signal path between the second RF amplification circuit and to the intermediary matching network.

17. The RF amplification device of claim 1 wherein the second RF amplification circuit comprises a push pull amplifier stage having a first push transistor and a first pull transistor, wherein the power control circuitry is further configured to:
bias the first pull transistor so that the first push transistor is turned off in the first power mode; and
bias the first push transistor so that the first pull transistor operates in a triode region in the first power mode.

18. The RF amplification device of claim 17 further comprising a matching network coupled to the push pull amplifier stage between the first pull transistor and the first push transistor and coupled to the cascode amplifier stage between the first input transistor and the first cascode output transistor, wherein the matching network comprises:
a first inductor wherein the first inductor coupled to the second RF amplification circuit and coupled to the cascode amplifier stage between the first cascode output transistor and the first input transistor;
a first capacitor connected in series with the first inductor; and
a second capacitor coupled in shunt to the second RF amplification circuit.

19. The RF amplification device of claim 1 wherein comprises a charge pump, and the first cascode output transistor includes a control contact and a supply contact wherein the power control circuitry is configured to bias the first cascode output transistor in the second power mode so that the first cascode output transistor operates in the triode region by being configured to:
generate a supply voltage from a power source voltage, wherein the supply contact of the first cascode output transistor is connected to be biased by the supply voltage; and
generate a transistor control voltage greater than the power source voltage with the charge pump, wherein the control contact of the first cascode output transistor is connected to be biased by the transistor control voltage.

20. The RF amplification device of claim 1 further comprising a matching network coupled to the second RF amplification circuit and to the cascode amplifier stage between the first input transistor and the first cascode output transistor, wherein the matching network comprises:
a first inductor wherein the first inductor coupled to the second RF amplification circuit and coupled to the cascode amplifier stage between the first cascode output transistor and the first input transistor;
a first capacitor connected in series with the first inductor;
a second capacitor coupled in shunt to the second RF amplification circuit; and
a switch device coupled in shunt to an intermediate tap of the first inductor.

21. The RF amplification device of claim 20 wherein the power control circuitry is further configured to:
operate the switch device in the first power mode so that the switch device is open; and
operate the switch device in the second power mode so that the switch device is closed.

22. The RF amplification device of claim 1 wherein the second RF amplification circuit comprises a first push pull amplifier stage having a first push transistor, a first pull transistor, a second cascode output transistor, and a third cascode output transistor, wherein:
the first push transistor and the second cascode output transistor are stacked in cascode;

the first pull transistor and the third cascode output transistor are stacked in cascode; and the second cascode output transistor and the third cascode output transistor are stacked in cascode.

23. The RF amplification device of claim 22 wherein the power control circuitry is configured to:
bias the first pull transistor so that the first push transistor is turned off in the first power mode;
bias the third cascode output transistor so that the first pull transistor is turned off in the first power mode;
bias the first push transistor so that the first push transistor operates in a triode region in the first power mode; and
bias the second cascode output transistor so that the second cascode output transistor operates in a triode region in the first power mode.

24. The RF amplification device of claim 23 wherein the power control circuitry is configured to:
bias the first push transistor so that the first push transistor operates in a saturation region in the second power mode;
bias the second cascode output transistor so that the second cascode output transistor operates in a saturation region in the second power mode;
bias the first pull transistor so that the first pull transistor operates in a saturation region in the second power mode; and
bias the third cascode output transistor so that the third cascode output transistor operates in a saturation region in the second power mode.

25. The RF amplification device of claim 22 wherein the second RF amplification circuit further comprises a driver amplifier stage and wherein the first push pull amplifier stage is a final amplifier stage of the second RF amplification circuit.

26. The RF amplification device of claim 25 wherein the driver amplifier stage is a second push pull amplifier stage having a second push transistor, a second pull transistor, a fourth cascode output transistor, and a fifth cascode output transistor, wherein:
the second push transistor and the fourth cascode output transistor are stacked in cascode;
the second pull transistor and the fifth cascode output transistor are stacked in cascode; and
the fourth cascode output transistor and the fifth cascode output transistor are stacked in cascode.

27. The RF amplification device of claim 1 comprising the second RF amplification circuit comprises a feedback circuit configured to maintain an input impedance of the second RF amplification circuit at approximately a characteristic impedance.

28. A method of amplifying a radio frequency (RF) signal comprising:
amplifying an RF signal with a first RF amplification circuit during a first power mode that includes a cascode amplifier stage having a first input transistor and a first cascode output transistor that are stacked in cascade, wherein the first RF amplification circuit further comprises a first cascode intermediary transistor stacked between the first input transistor and the first cascode output transistor;
biasing the first cascode output transistor so that the first cascode output transistor operates in a saturation region in the first power mode;
biasing the first cascode intermediary transistor such that the first cascode intermediary transistor operates in the saturation region in the first power mode;
amplifying the RF signal with a second RF amplification circuit during a second power mode, wherein the second RF amplification circuit is coupled to the cascode amplifier stage between the first input transistor and the first cascode output transistor; and
biasing the first cascode intermediary transistor so that the first cascode intermediary transistor is turned off in the second power mode; and
biasing the first cascode output transistor in the second power mode so that the first cascode output transistor operates in a triode region.

29. The method of claim 28 further comprising:
biasing the first RF amplification circuit so that the first RF amplification circuit is deactivated in the second power mode; and
biasing the second RF amplification circuit so that the second RF amplification circuit is deactivated in the first power mode.

* * * * *